United States Patent [19]
Golla et al.

[11] Patent Number: 5,617,356
[45] Date of Patent: Apr. 1, 1997

[54] REGULATION CIRCUIT AND METHOD FOR THE ERASING PHASE OF NON-VOLATILE MEMORY CELLS

[75] Inventors: Carla Golla, Sesto San Giovanni; Silvia Padoan, Rimini; Marco Olivo, Bergamo, all of Italy

[73] Assignee: SGS-Thomson Microelectronics S.r.l., Agrate Brianza, Italy

[21] Appl. No.: 395,361

[22] Filed: Feb. 21, 1995

[30] Foreign Application Priority Data

Feb. 21, 1994 [EP] European Pat. Off. ............ 94830077

[51] Int. Cl.$^6$ ................................................ G11C 16/02
[52] U.S. Cl. ............................ 365/185.25; 365/185.23; 365/185.26; 365/185.29
[58] Field of Search ..................... 365/185.26, 185.29, 365/185.23, 185.25

[56] References Cited

U.S. PATENT DOCUMENTS 5,051,953  9/1991  Kitazawa et al. .................. 365/185

FOREIGN PATENT DOCUMENTS 0550751  7/1993  European Pat. Off. ........ G11C 16/06

OTHER PUBLICATIONS

IEEE Journal Of Solid-State Circuits, vol. 26, No. 11, Nov. 1991, New York US, pp. 1600–1605, Nakayama et al. "A 60ns 16-Mb Flash EEPROM With Program and Erase Sequence Controller".

Primary Examiner—Joseph E. Clawson, Jr.
Attorney, Agent, or Firm—David M. Driscoll; James H. Morris

[57] ABSTRACT

A regulating circuit for discharging non-volatile memory cells in an electrically programmable memory device, of the type which comprises at least one switch connected between a programming voltage reference and a line shared by the source terminals of the transistors forming said memory cells, and at least one discharge connection between said common line to the source terminals and a ground voltage reference, further comprises a second connection to ground of the line in which a current generator is connected and a normally open switch. Also provided is a logic circuit connected to the line to compare the voltage value present on the latter with a predetermined value, and to output a control signal for causing the switch to make. This solution allows a slow discharging phase of the line to be effected at the end of the erasing phase.

23 Claims, 3 Drawing Sheets

REGULATION CIRCUIT AND METHOD FOR THE ERASING PHASE OF NON-VOLATILE MEMORY CELLS

BACKGROUND OF THE INVENTION

1. Field of the Invention

This invention relates to a regulating circuit for discharging non-volatile memory cells in an electrically programmable memory device.

The invention also concerns a method for improving the efficiency of the discharging phase of such memory cells.

More particularly, the invention relates to a regulating circuit which comprises: at least one switch connected between a programming voltage reference and a common line to the source terminals of the transistors which form said memory cells; and at least one discharge connection between said common line to the source terminals and a ground voltage reference.

2. Discussion of the Related Art

As is well known, a non-volatile memory cell comprises a MOS transistor having a "floating" gate terminal, that is a high DC impedance to all the other terminals of that cell and the circuit in which the cell is connected.

The cell also comprises a second electrode, called the control gate, which is driven by suitable control voltages. The other electrodes of the MOS transistor are standard drain, source, and body terminals.

By changing the value of the voltage applied to the control gate, the amount of the charge present on the floating gate can be varied. This allows the transistor to be set for two different logic states: a first state with a "high" threshold voltage and a second state with a "low" threshold voltage.

If an intermediate voltage between these two values is applied to the control gate, the transistor state can be "read", since the transistor would either have a low or a high impedance between its drain and source terminals, depending on the value of the threshold voltage. Thus, the transistor functions as a logic memory element.

In addition, since the floating gate has a high impedance to any other terminals of the cell, the charge stored in the transistor can be maintained for an indefinite time, even if the power supply is removed from the circuit in which it is connected. Thus, the cell has non-volatile memory characteristics.

The operation whereby a charge is stored on the floating gate is referred to as the cell "programming", whereas the operation which results in the charge being removed from the floating gate is referred to as the cell "erasing".

A non-volatile memory circuit integrated to a semiconductor usually comprises a very large number of cells arranged basically into a matrix having plural rows (word line) and columns (bit line). The cells from one word line have in common the line which drives their respective control gates. The cells from one bit line have in common their respective drain terminals.

It is a well recognized fact that in order to erase the contents of a given memory cell, the source terminal is to be brought to appropriate positive voltage values.

Specifically, the cell is erased by initially applying a very high (higher than 10 V) voltage to the source electrode. On completion of this phase, the source terminal is connected to a ground voltage reference. In this manner, all the voltage is discharged from said terminal.

In the matrix of an ordinary memory device, the lines which interconnect the source terminals (SOURCE) are laid, however, side-by-side with the gate terminal lines, i.e. the word lines (WL) of the matrix cells, as shown in FIG. 1, for example.

There exists, accordingly, a parasitic capacitive coupling (Cpar) between these lines. This coupling may cause the voltage of adjacent word lines to drop at the end of the erasing phase, that is when the voltage of the source terminal line is discharged at a very fast rate.

If the word line voltage drops to negative values, the junction diodes of the transistors comprising the memory cells become forward biased, which may erase or alter the contents of memory cells other than the selected ones.

The seriousness of such a potential mishap can be readily appreciated.

An object of the present invention is to provide a regulating circuit which can ensure a slow decrease of the source terminal voltage at the end of the erasing phase, to thereby control the effectuation of the memory matrix cell discharging operations and overcome the drawbacks with which prior approaches have been beset.

SUMMARY OF THE INVENTION

The solutive idea on which is invention is based is that of providing a circuit which can control and slow down the source terminal line discharging, at least during an initial transient phase when a sharp drop in the voltage on such source terminals could impair the proper operation of the memory device.

Advantageously, the regulating circuit of this invention comprises a logic structure indicating when the source voltage reaches a sufficiently low value, that is a voltage value whereat a sharp drop in the voltage, and attendant coupling between the source terminal line and adjacent word lines, can no longer endanger the proper operation of the device.

Below a predetermined value, a fast discharge phase of the source terminal line will then take place which complete the memory cell erasing phase.

In one general aspect, the invention features a regulating circuit for discharging non-volatile memory cells in an electrically programmable memory device. The regulating circuit includes a switch connected between a programming voltage reference and a line shared by source terminals of transistors forming the memory cells. It also comprises a discharge connection between the line and a ground voltage reference. The discharge connection includes a device for driving in a controlled manner the current flowing through the connection to discharge the line at a slow rate. The device comprises a further connection of the line to ground with a normally open switch and a current generator connected in that connection.

A discharging transistor can be connected in the discharge connection, with the generator in parallel with the discharging transistor. The regulating circuit can also include a logic circuit connected to the line to compare the voltage value on the line with a predetermined threshold value, as well as a switch connected to the programming voltage reference and to the discharging transistor and operated by a signal produced by the logic circuit to turn on the discharging transistor. The logic circuit can include a set of logic gates which are connected together and of which at least one is connected to the detector output. The output of at least one logic gate can have its input connected to the detector and its output fed back to its input through a transistor which is supplied with the supply voltage. The detector can have a threshold voltage value selected to minimize the capacitive coupling between the source terminal line and its adjacent word lines in the memory device.

In another general aspect, the invention features a method for regulating the discharge phase of non-volatile memory cells in electrically programmable memory devices. The method includes an erasing step wherein a relatively high voltage is applied to the source terminals of the transistors forming the cells, and a slow discharge step wherein the terminals are connected to a ground voltage reference. The slow discharge step is carried out by driving a current flow to ground to obtain a slow rate discharge. The method also includes detecting, during the slow discharge step, when the voltage at the source terminals reaches a threshold voltage selected to minimize the capacitive coupling between the source terminal line and its adjacent word lines in the memory device. A fast rate discharge step is initiated in response to the reaching of the threshold voltage.

The features and advantages of a circuit according to this invention will be apparent from the following detailed description of an embodiment thereof, given by way of example and not of limitation with reference to the accompanying drawings.

DETAILED DESCRIPTION

Figure 1:
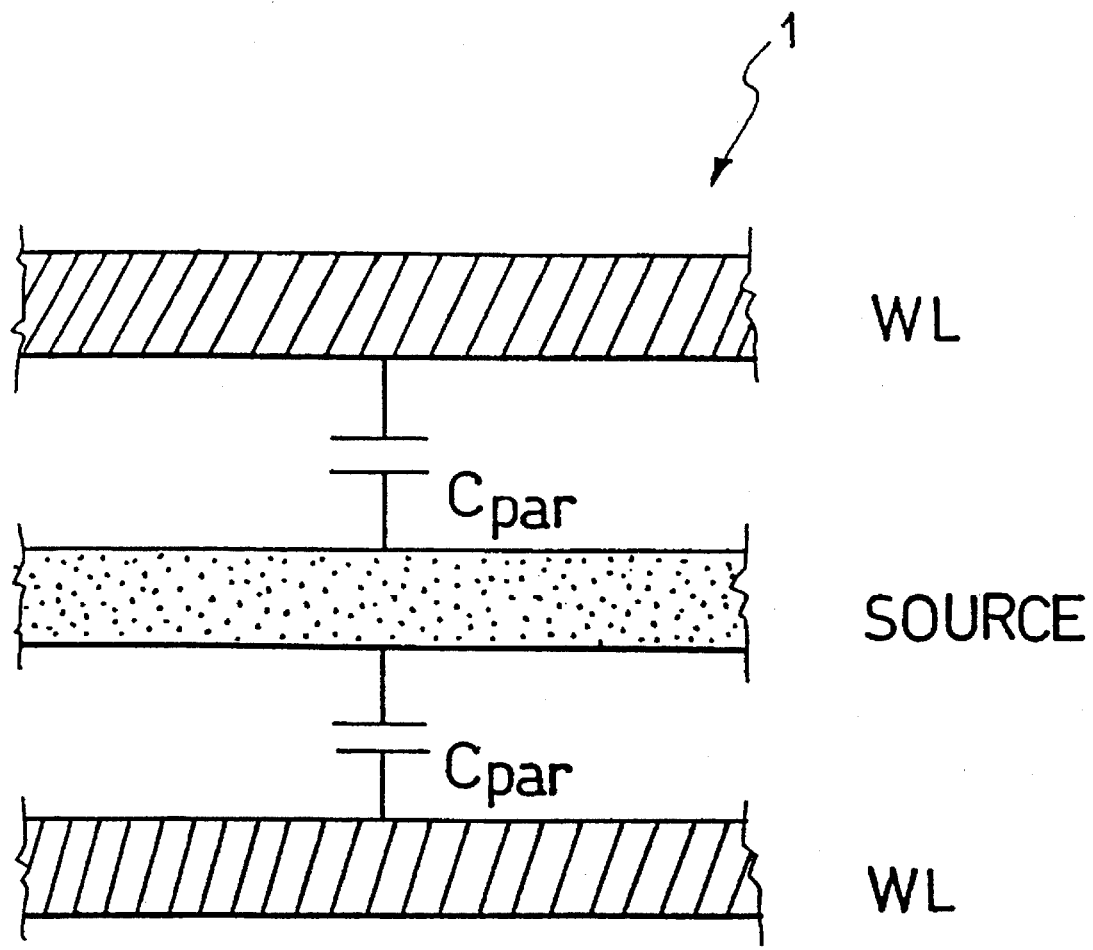
FIG. 1 shows schematically a detail of a cell matrix structure of a conventional semiconductor non-volatile memory device.
Figure 2:
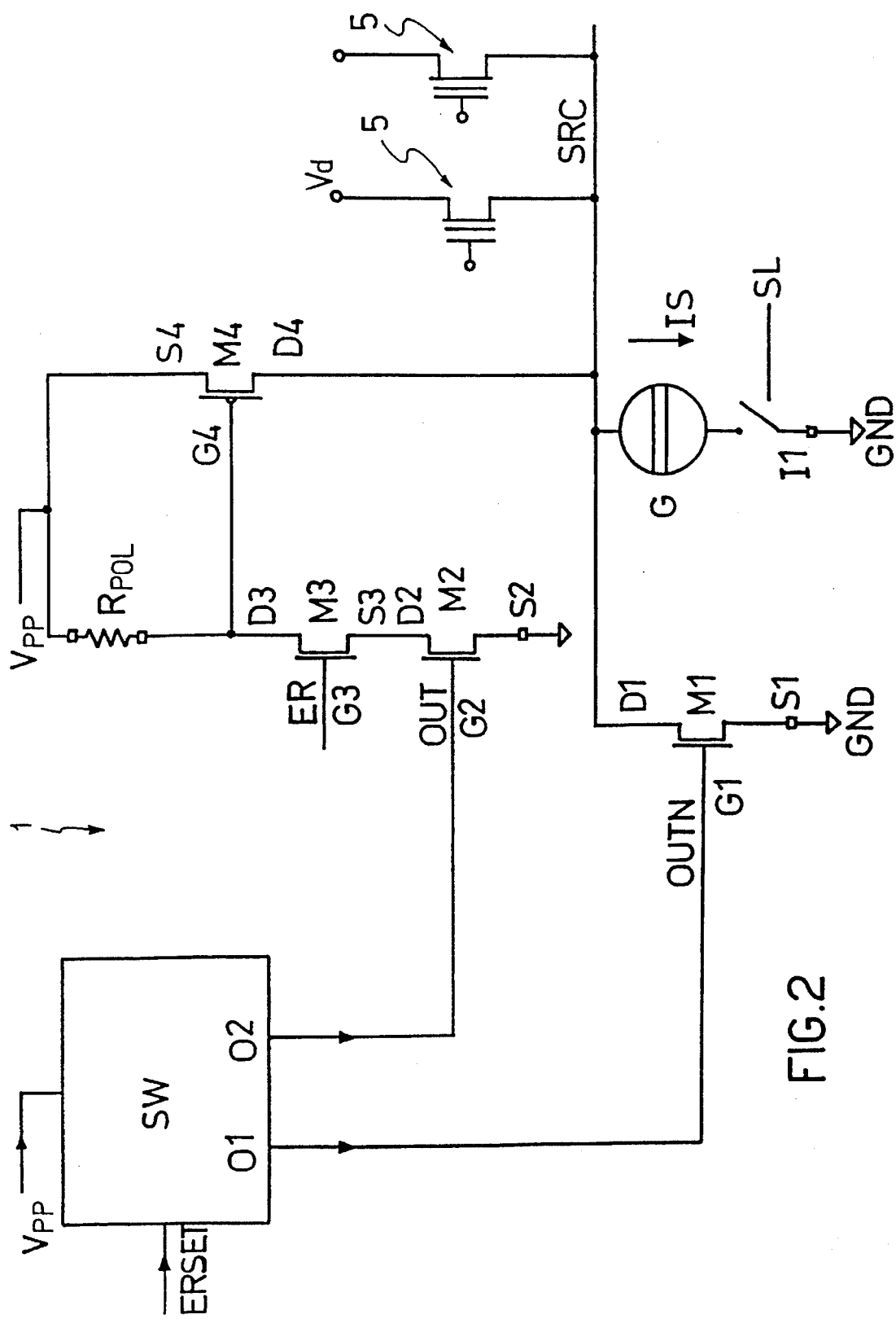
FIG. 2 shows schematically a regulating circuit according to the invention.

With reference to the FIGS. 1 and 2, generally shown at 1 is a circuit, according to the invention, for regulating the discharging phase of non-volatile memory cells 5 incorporated to an electrically programmable memory device.

The circuit 1 comprises a logic switch SW which is supplied a first programming voltage reference VPP and operated by a logic signal ERSET. This switch is intended to trigger the erasing phase first, and then the fast discharging mechanism for the voltage present on the source terminals of a non-volatile memory cell 5, as described hereinafter.

The logic switch SW has two outputs O1 and O2. A first output, O1, is connected to the gate terminal G1 of a first discharging transistor M1 of the n-channel MOS type whose source terminal S1 is connected to the ground voltage reference GND of the circuit.

The drain terminal of the discharging transistor M1 is connected to a source line SRC shared by all the transistors forming the cells 5 in one word line.

Advantageously, according to the invention, a device for driving in a controlled manner the current flowing toward ground during the line SRC discharging is provided. This device includes a further connection of said line SRC to ground.

In particular, the source line SRC has a current generator G connected thereto which is connected to ground GND through a switch I1. This switch I1 is operated by a logic signal SL.

The additional connection to ground is not a strict requirement, because circuit means, coupled to the same discharging transistor M1, may be arranged to drive the slow discharging of the line SRC in any event.

The second output, O2, of the switch SW is connected to the gate terminal G2 of a control transistor M2, of the n-channel MOS type. The source terminal S2 of said transistor M2 is connected to ground GND, and its drain terminal D2 is connected to the source terminal of a transistor M3, also of the n-channel MOS type.

The transistor M3 receives a signal ER on its gate terminal G3, and has its drain terminal D3 connected to the programming voltage reference VPP via a resistive biasing element RPOL. A fourth MOS transistor M4, of the p-channel type, is connected in the circuit 1 with its gate terminal G4 taken to the drain D3 of the transistor M3.

Furthermore, the transistor M4 has its drain terminal D4 connected to the source line SRC and its source terminal S4 connected to the programming line VPP.

The transistors M2, M3 and M4, in combination with the resistor RPOL, may be considered equivalent essentially to a pair of normally open switches controlled to "make" by respective signals ER and OUT. Therefore, all these components have been included to the block denoted by 6, to bring out the possibility that a single interconnection element—comprising, in fact, a switch pair operated by control signals—be used to apply a high voltage, e.g. the programming voltage VPP, to the line SRC during the erasing phase.

Figure 3:
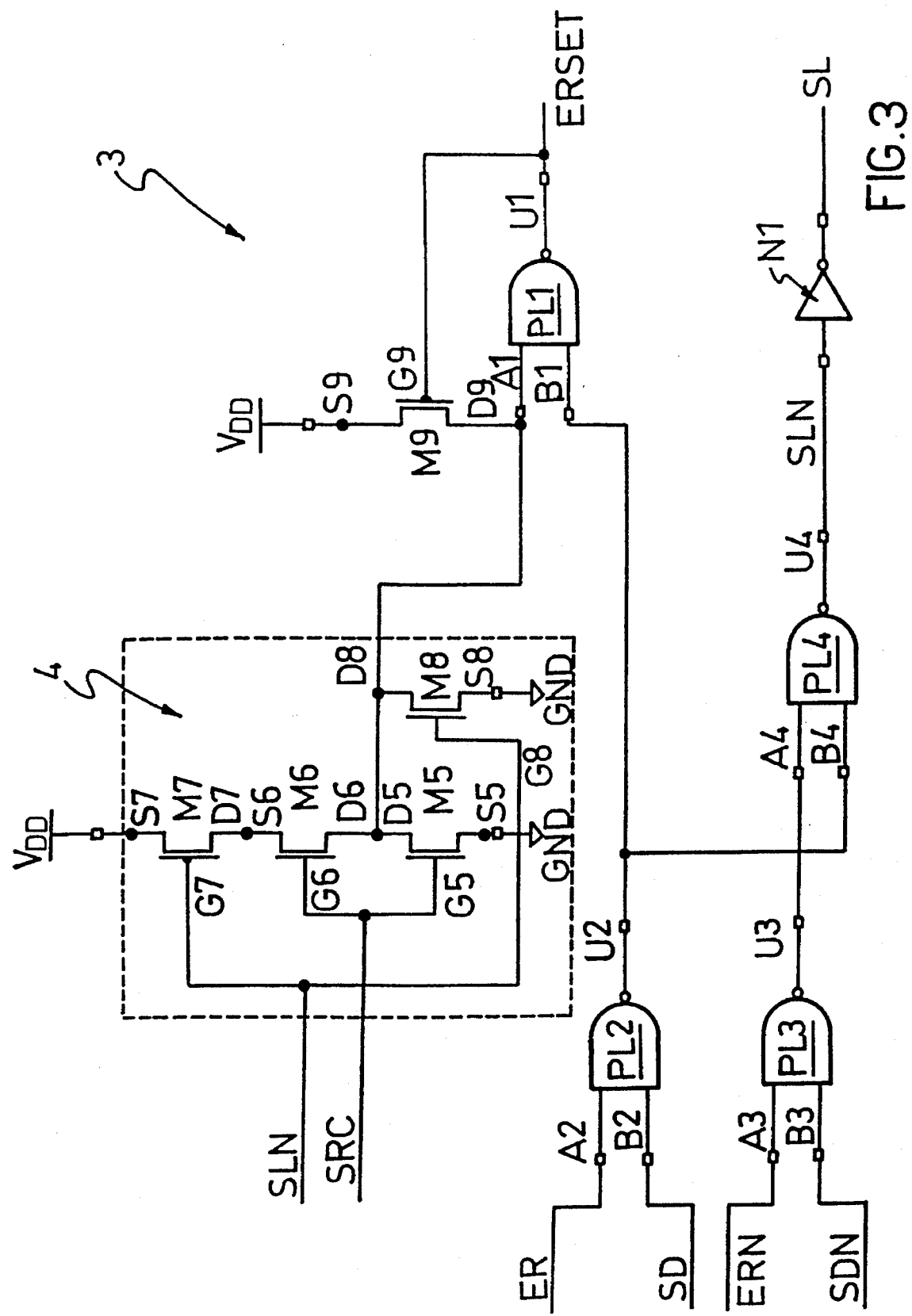
FIG. 3 shows schematically a logic circuit generating signals present in the circuit of FIG. 2.

Shown in FIG. 3 is a logic circuit, generally denoted by 3, for generating control signals present in the circuit of FIG. 2.

The logic circuit 3 comprises a detector 4 connected between a supply voltage reference VDD and ground GND. This detector functions basically as a logic gate of the NOR type receiving respective signals SLN and SRC on two inputs.

The detector 4 comprises a first transistor M5 of the n-channel MOS type having its source terminal S5 connected to ground GND. The drain terminal D5 of the transistor M5 is connected to the drain terminal D6 of a second transistor M6 of the p-channel type.

The gate terminals G5 and G6 of the transistors M5 and M6 are connected to each other and to the source line SRC.

The source terminal S6 of the transistor M6 is connected to the drain terminal D7 of a third transistor M7 of the p-channel MOS type.

The source terminal S7 of the MOS transistor M7 is connected to the supply voltage reference VDD, whereas the gate terminal G7 thereof is in common with the gate terminal G8 of a fourth transistor M8 of the n-channel MOS type. These gate terminals, G7 and G8, are applied a negative logic signal SLN.

The transistor M8 has its source terminal S8 connected to ground GND, and its drain terminal D8 connected to the terminals D5 and D6 and to a first input A1 of a logic gate PL1 of the NAND type. Also connected to this first input A1 is the drain terminal D9 of a p-channel transistor M9 whose source terminal S9 is connected to the power supply VDD and whose gate terminal G9 is connected to the output U1 of the aforesaid logic gate PL1. It is at this output U1 that the erase signal ERSET applied to the switch SW is produced.

A second input B1 of the logic gate PL1 is connected to the output U2 of a second logic gate PL2 of the NAND type having two inputs.

The inputs A2 and B2 of this logic gate PL2 receive respective logic signals ER and SD. A front edge of the former signal initiates the erasing phase, whereas the latter enables the intervention on a given memory portion to be erased.

A third NAND logic gate PL3 having two inputs A3 and B3 receives respective negative logic signals ERN and SDN.

The output U3 of the NAND logic gate PL3 is connected to a first input A4 of a fourth logic gate PL4, also of the NAND type, having two inputs. The output U2 of the logic gate PL2 is connected to the second input B4 of the fourth logic gate PL4.

The output U4 of the logic gate PL4 produces the signal SLN and is connected to the input of a logic inverter N1 from whose output the signal SL is taken.

The regulating method with the circuit according to the invention will now be described.

Each memory cell 5 to be erased is selected in a known manner. For erasing, the line SRC is brought to a high voltage level, above 10 volts, through the erasing transistor M4 connected to the programming voltage VPP and driven by the control transistors M2 and M3.

On completion of the erasing phase, the source terminal line SRC will have an erase voltage value, in excess of 10 V. This voltage must be discharged to ground.

For this purpose, the signal SL is brought to a high, and causes the switch I1 to "make". Thereafter, during the initial phase of the source line SRC discharging—i.e. with the line voltage particularly and dangerously high—the voltage on the line SRC is slowly discharged in a controlled manner by means of the current Is from the generator G in FIG. 2.

Advantageously, the signal SL will then operate the switch I1 to hold the connection to ground of the current generator G, whereby the slow controlled discharging of this voltage from the line SRC is continued.

The detector 4 outputs a signal at a logic low until the voltage on the source terminal line SRC drops to below the detector threshold.

As the slow discharge approaches its end and the line SRC voltage decreases to below the predetermined threshold value of the detector 4, the switch I1 still holds the connection of the generator G to ground, and the detector 4 issues the signal ERSET=1 through the logic gate PL1.

When below this predetermined voltage, a fast discharging phase of the line SRC is then triggered which completes the discharging phase of the memory cells 5.

In fact, the signal ERSET will, by operating the switch SW, activate the output O1 and transmit an output signal OUTN at a logic high to the gate G1 of the discharging transistor M1.

The discharging transistor M1 is, therefore, turned on to permit the line SRC to be discharged at a fast rate to ground.

It will be appreciated that the threshold value of the detector 4 should be selected such that the fast discharge of the source terminal line SRC from that very value will be of no danger in relation to the capacitive coupling Cpar to the adjacent word lines. In this way, the regulating circuit of this invention can overcome the prior art problems to make the discharging operations of the cells in a memory matrix effective and reliable.

The circuit described hereinabove may be altered and modified within the scope of the invention as defined in the following claims.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A regulating circuit for discharging non-volatile memory cells in an electrically programmable memory device, which comprises:

a first switch connected between a programming voltage reference and a line shared by source terminals of transistors forming the memory cells;

a first discharge connection between the line and a ground voltage reference, comprising:

a current generator for driving in a controlled manner the current flowing through the connection to discharge the line at a slow rate, the current generator being connected in the first discharge connection, and a second, normally open, switch connected in the first discharge connection, a second discharge connection, wherein a discharging transistor is connected in the second discharge connection, and wherein in the current generator is in parallel with the discharging transistor, a logic circuit connected to the line to compare the voltage value present thereon with a predetermined threshold value, and a third switch connected to the programming voltage reference and to the discharging transistor and operated by a signal produced by the logic circuit to turn on the discharging transistor.

2. A regulating circuit according to claim 1, wherein the logic circuit comprises a detector connected between a supply voltage reference and ground, and a set of logic gates which are connected together and of which at least one is connected to the detector output.

3. A regulating circuit according to claim 2, wherein the at least one logic gate has its input connected to the detector and its output fed back to its input through a transistor which is supplied with the supply voltage.

4. A regulating circuit according to claim 2, wherein the detector has a threshold voltage value selected to minimize the capacitive coupling between the source terminal line and its adjacent word lines in the memory device.

5. A method for regulating the discharge phase of non-volatile memory cells in electrically programmable memory devices, comprising:

an erasing step wherein a relatively high voltage is applied to the source terminals of the transistors forming the cells;

a slow discharge step wherein the terminals are connected to a ground voltage reference, which slow discharge step is carried out by driving a current flow to ground to obtain a slow rate discharge;

a step of detecting, during the slow discharge step, when the voltage at the source terminals reaches a threshold voltage selected to minimize the capacitive coupling between the source terminal line and its adjacent word lines in the memory device; and a fast rate discharge step initiated in response to the reaching of the threshold voltage in the step of detecting.

6. A circuit in a non-volatile electrically programmable memory device comprising memory cells, which circuit comprises:

a first switch connected between a programming voltage reference and a line shared by source terminals of transistors forming the memory cells;

a first discharge connection between the line and a ground voltage reference;

a discharging transistor operatively connected in a second discharge connection between the line and the ground voltage reference; and a detector circuit with an input, an output, and a predetermined threshold voltage value, the input of the detector being operatively connected to detect the voltage on the line and the output of the detector being operatively connected to the discharging transistor in the second discharge connection, and wherein the threshold voltage value minimizes the capacitive coupling between the source terminal line and its adjacent word lines in the memory device.

7. A circuit according to claim 6, further comprising a second switch operatively connected to control the first switch, and wherein the output of the detector is operatively connected to control the second switch.

8. A circuit according to claim 7 further comprising a third switch connected to the programming voltage reference and wherein the output of the detector is operatively connected to the discharging transistor and to the second switch via the third switch.

9. A circuit according to claim 6, further including at least one logic gate, which has its input operatively connected to the output of the detector and its output fed back to its input through a transistor operatively connected to the supply voltage.

10. A circuit according to claim 6, further including a current source operatively connected in the first discharge connection.

11. A non-volatile memory cell discharge regulation method, comprising:

applying a relatively high voltage to source terminals of transistors forming cells in a memory;

first generating a discharge current in a current generator from the cells through the terminals to ground at a first discharge rate;

detecting when the voltage at the source terminals reaches a threshold voltage during the first discharging step, and when the voltage at the source terminals reaches the threshold voltage, further discharging the cells through the terminals to ground at a second rate that is faster than the first discharge rate, wherein the further discharging step is initiated in response to the reaching of the threshold voltage by the voltage at the source terminals in the step of detecting.

12. A method according to claim 11, wherein the step of detecting employs as its threshold voltage a voltage that minimizes the capacitive coupling between the source terminal line and its adjacent word lines in the memory device.

13. A circuit in a non-volatile electrically programmable memory device comprising memory cells, which circuit comprises:

a first switch connected between a programming voltage reference and a line shared by source terminals of transistors forming the memory cells;

a first discharge connection between the line and a ground voltage reference;

a discharging transistor operatively connected in a second discharge connection between the line and the ground voltage reference;

a detector circuit with an input, an output, and a predetermined threshold, the input of the detector being operatively connected to the line shared by source terminals; and a logic gate, which has its input operatively connected to the output of the detector and its output fed back to its input through a transistor operatively connected to the supply voltage, the output of the logic gate being operatively connected to the discharging transistor in the second discharge connection.

14. A circuit according to claim 13, further comprising a second switch operatively connected to control the first switch, and wherein the output of the logic gate is operatively connected to the second switch.

15. A circuit according to claim 14, further comprising a third switch connected to the programming voltage reference and to the discharging transistor and wherein the output of the logic gate is operatively connected to the discharging transistor and to the second switch via the third switch.

16. A circuit according to claim 13, further including a current source operatively connected in the first discharge connection.

17. A circuit in a non-volatile electrically programmable memory device comprising memory cells, which circuit comprises:

a switch connected between a programming voltage reference and a line shared by source terminals of transistors forming the memory cells;

a first discharge connection between the line and a ground voltage reference;

a discharging transistor operatively connected in a second discharge connection between the line and the ground voltage reference;

a detector circuit with an input, an output, and a predetermined threshold, the input of the detector being operatively connected to the line shared by source terminals, and the output of the detector being operatively connected to the discharging transistor in the second discharge connection; and a second switch operatively connected to control the first switch, wherein the output of the detector is operatively connected to the second switch.

18. A circuit according to claim 17, further comprising a third switch connected to the programming voltage reference and to the discharging transistor and wherein the output of the detector is operatively connected to the discharging transistor and to the second switch via the third switch.

19. A circuit according to claim 17, wherein the device comprises a discharging transistor connected in the second discharge connection.

20. A circuit according to claim 17, further including a current source operatively connected in the first discharge connection.

21. A non-volatile memory cell discharge regulation method, comprising:

applying a relatively high voltage to the source terminals of transistors forming cells in the memory;

first discharging the cells through the source terminals to ground at a first discharge rate;

detecting when the voltage at the source terminals reaches a threshold voltage during the first discharging step;

initiating, in response to the reaching of the threshold voltage in the Step of detecting, a step of further discharging the cells through the terminals to ground at a rate that is faster than the first discharge rate; and initiating, in response to the reaching of the threshold voltage in the step of detecting, a step of removing the relatively high voltage from the source terminals of the transistors forming the cells.

22. A method according to claim 21, wherein the step of detecting employs as its threshold voltage a voltage that minimizes the capacitive coupling between the source terminal line and its adjacent word lines in the memory device.

23. A method according to claim 21, wherein the step of first discharging includes the step of generating a current through the terminals to ground by a current source.

* * * * *